United States Patent
Hudson et al.

(10) Patent No.: US 9,418,859 B2
(45) Date of Patent: *Aug. 16, 2016

(54) PLASMA-ENHANCED ETCHING IN AN AUGMENTED PLASMA PROCESSING SYSTEM

(71) Applicant: Lam Research Corporation, Fremont, CA (US)

(72) Inventors: Eric A. Hudson, Berkeley, CA (US); Andrew D. Bailey, III, Pleasanton, CA (US); Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/676,711

(22) Filed: Apr. 1, 2015

(65) Prior Publication Data

US 2015/0206775 A1    Jul. 23, 2015

Related U.S. Application Data (63) Continuation of application No. 13/626,793, filed on Sep. 25, 2012.

(60) Provisional application No. 61/693,382, filed on Aug. 27, 2012.

(51) Int. Cl.
*H01L 21/3065* (2006.01)
*H01L 21/3213* (2006.01)
(Continued)

(52) U.S. Cl.
CPC .......... *H01L 21/3065* (2013.01); *H01J 37/321* (2013.01); *H01J 37/32009* (2013.01);
(Continued)

(58) Field of Classification Search
None
See application file for complete search history.

(56) References Cited

U.S. PATENT DOCUMENTS 4,600,464 A    7/1986 Desilets et al.
6,007,673 A   12/1999 Kugo et al.
(Continued)

FOREIGN PATENT DOCUMENTS

CN    1716530 A    1/2006
CN  102834905 A   12/2012
(Continued)

OTHER PUBLICATIONS

S. Wolf and R.N. Tauber, Silicon Processing for the VLSI Era, vol. 1, Lattice Press, ISBN 0-9616721-6-1, year 2000, p. 672.*
(Continued)

*Primary Examiner* — Jiong-Ping Lu
(74) *Attorney, Agent, or Firm* — Weaver Austin Villeneuve & Sampson LLP (57) ABSTRACT

Methods for etching a substrate in a plasma processing chamber having at least a primary plasma generating region and a secondary plasma generating region separated from said primary plasma generating region by a semi-barrier structure. The method includes generating a primary plasma from a primary feed gas in the primary plasma generating region. The method also includes generating a secondary plasma from a secondary feed gas in the secondary plasma generating region to enable at least some species from the secondary plasma to migrate into the primary plasma generating region. The method additionally includes etching the substrate with the primary plasma after the primary plasma has been augmented with migrated species from the secondary plasma.

16 Claims, 3 Drawing Sheets

(51) Int. Cl.
*H01J 37/32* (2006.01)
*H01L 21/311* (2006.01)
*H01L 21/67* (2006.01)

(52) U.S. Cl.
CPC ..... *H01J 37/32091* (2013.01); *H01J 37/32192* (2013.01); *H01J 37/32357* (2013.01); *H01J 37/32449* (2013.01); *H01J 37/32458* (2013.01); *H01J 37/32715* (2013.01); *H01L 21/31116* (2013.01); *H01L 21/31138* (2013.01); *H01L 21/32136* (2013.01); *H01L 21/67069* (2013.01); *H01J 2237/334* (2013.01)

(56) References Cited

U.S. PATENT DOCUMENTS

| | | | |
|---|---|---|---|
| 6,013,580 | A | 1/2000 | Yanagida |
| 6,101,970 | A | 8/2000 | Koshimizu |
| 6,162,323 | A | 12/2000 | Koshimizu |
| 6,689,283 | B2 | 2/2004 | Hattori et al. |
| 6,851,384 | B2 | 2/2005 | Yuda et al. |
| 7,244,474 | B2 | 7/2007 | Hanawa et al. |
| 7,291,360 | B2 | 11/2007 | Hanawa et al. |
| 7,520,999 | B2 | 4/2009 | Chandrachood et al. |
| RE40,951 | E | 11/2009 | Kodaira et al. |
| 7,695,590 | B2 | 4/2010 | Hanawa et al. |
| 7,767,561 | B2 | 8/2010 | Hanawa et al. |
| 7,909,961 | B2 | 3/2011 | Kumar et al. |
| 8,058,156 | B2 | 11/2011 | Hanawa et al. |
| 8,349,128 | B2 | 1/2013 | Todorow et al. |
| 8,356,575 | B2 | 1/2013 | Sasaki et al. |
| 9,017,526 | B2 | 4/2015 | Singh et al. |
| 9,039,911 | B2* | 5/2015 | Hudson ............ H01J 37/32091 156/345.33 |
| 9,147,581 | B2 | 9/2015 | Guha |
| 9,230,819 | B2 | 1/2016 | Paterson et al. |
| 9,245,761 | B2 | 1/2016 | Singh et al. |
| 9,257,295 | B2 | 2/2016 | Singh et al. |
| 2002/0179248 | A1 | 12/2002 | Kabansky |
| 2003/0227258 | A1 | 12/2003 | Strang et al. |
| 2004/0014325 | A1* | 1/2004 | Laermer ............ H01J 37/321 438/710 |
| 2004/0221958 | A1 | 11/2004 | Loewenhardt et al. |
| 2005/0025791 | A1 | 2/2005 | Remenar et al. |
| 2005/0211171 | A1 | 9/2005 | Hanawa et al. |
| 2005/0211546 | A1 | 9/2005 | Hanawa et al. |
| 2005/0211547 | A1 | 9/2005 | Hanawa et al. |
| 2005/0287811 | A1 | 12/2005 | Inukai |
| 2006/0000805 | A1 | 1/2006 | Todorow et al. |
| 2006/0021701 | A1 | 2/2006 | Tobe et al. |
| 2006/0102286 | A1 | 5/2006 | Kim |
| 2007/0000611 | A1 | 1/2007 | Shannon et al. |
| 2007/0017898 | A1 | 1/2007 | Kumar et al. |
| 2007/0068624 | A1 | 3/2007 | Jeon et al. |
| 2007/0247073 | A1 | 10/2007 | Paterson et al. |
| 2008/0060759 | A1* | 3/2008 | Chen ............ H01J 37/32192 156/345.41 |
| 2008/0178805 | A1 | 7/2008 | Paterson et al. |
| 2008/0280429 | A1 | 11/2008 | Mathew et al. |
| 2010/0000964 | A1 | 1/2010 | Chen |
| 2010/0273332 | A1 | 10/2010 | Edelberg |
| 2011/0151673 | A1 | 6/2011 | Noda et al. |
| 2011/0177694 | A1 | 7/2011 | Chen et al. |
| 2012/0031559 | A1 | 2/2012 | Dhindsa et al. |
| 2012/0034786 | A1 | 2/2012 | Dhindsa et al. |
| 2012/0104274 | A1 | 5/2012 | Hirayanagi et al. |
| 2012/0273130 | A1 | 11/2012 | Drewery et al. |
| 2012/0322011 | A1 | 12/2012 | Wu et al. |
| 2013/0059448 | A1 | 3/2013 | Marakhtanov et al. |
| 2013/0168352 | A1 | 7/2013 | Fischer |
| 2014/0054269 | A1 | 2/2014 | Hudson et al. |
| 2014/0251790 | A1 | 9/2014 | Kodaira et al. |
| 2014/0302678 | A1 | 10/2014 | Paterson et al. |
| 2014/0302680 | A1 | 10/2014 | Singh et al. |
| 2014/0302681 | A1 | 10/2014 | Paterson et al. |
| 2015/0011093 | A1 | 1/2015 | Singh et al. |
| 2015/0017810 | A1 | 1/2015 | Guha |
| 2015/0083582 | A1 | 3/2015 | Dhindsa et al. |
| 2015/0179465 | A1 | 6/2015 | Singh et al. |
| 2015/0364339 | A1 | 12/2015 | Guha |
| 2015/0364349 | A1 | 12/2015 | Guha |

FOREIGN PATENT DOCUMENTS

| | | | |
|---|---|---|---|
| JP | H07235397 | A | 9/1995 |
| JP | 2604684 | B2 | 4/1997 |
| JP | 2012531520 | A | 12/2012 |

OTHER PUBLICATIONS

US Office Action, dated Jan. 14, 2015, issued in U.S. Appl. No. 13/916,318.
US Office Action, dated May 8, 2015, issued in U.S. Appl. No. 13/916,318.
US Office Action, dated Feb. 10, 2015, issued in U.S. Appl. No. 13/939,709.
US Notice of Allowance, dated May 21, 2015, issued in U.S. Appl. No. 13/939,709.
US Examiner's Amendment Communication, dated Jun. 26, 2015, issued in U.S. Appl. No. 13/939,709.
US Notice of Allowance, dated Jan. 16, 2015, issued in U.S. Appl. No. 13/936,930.
US Office Action, dated May 15, 2015, issued in U.S. Appl. No. 14/184,491.
US Office Action, dated Oct. 11, 2013, issued in U.S. Appl. No. 13/626,793.
US Final Office Action, dated Feb. 13, 2014, issued in U.S. Appl. No. 13/626,793.
US Office Action, dated Jul. 16, 2014, issued in U.S. Appl. No. 13/626,793.
US Notice of Allowance, dated Jan. 2, 2015, issued in U.S. Appl. No. 13/626,793.
US Office Action, dated May 21, 2014, issued in U.S. Appl. No. 13/227,404.
Suda et al., (2012) "Development of Cu Etching Using $O_2$ Cluster Ion Beam under Acetic Acid Gas Atmosphere", *Japanese Journal of Applied Physics*, 51:08HA02-1-08HA02-5.
Wolf, S. and R.N. Tauber, R.N. (2000) "Silicon Processing for the VLSI Era," Chapter 14, Dry Etching for ULSI Fabrication, *Lattice Press*, ISBN 0-9616721-6-1, 1:673-676.
Xiao, (2001) "Introduction to Semiconductor Manufacturing Technology", *Published by Prentice Hall*, ISBN 0-13-022404-9, Chapter 7, p. 230.
U.S. Patent Application entitled "Internal Plasma Grid for Semiconductor Fabrication," Singh et al., U.S. Appl. No. 14/943,483, filed Nov. 17, 2015.
U.S. Patent Application entitled "Ion Beam Etching System," Singh et al., U.S. Appl. No. 14/996,656, filed Jan. 15, 2016.
U.S. Patent Application entitled "Internal Plasma Grid Applications for Semiconductor Fabrication," Paterson et al., U.S. Appl. No. 14/954,586, filed Nov. 20, 2015.
US Notice of Allowance, dated Oct. 7, 2015, issued in U.S. Appl. No. 13/916,318.
US Notice of Allowance, dated Oct. 2, 2015, issued in U.S. Appl. No. 14/637,260.
US Notice of Allowance, dated Aug. 28, 2015, issued in U.S. Appl. No. 14/184,491.
Chinese First Office Action dated Sep. 17, 2015 issued in CN Application No. 2013-10379780.0.

* cited by examiner

| ROW NUMBER | ETCH APPLICATION | SECONDARY GAS | PRIMARY GAS | POWER REGIME | BENEFIT |
|---|---|---|---|---|---|
| 1 | CD shrink (BARC, SiARC) | H2 | CF4, CHxFy | Very low bias | Control polymer independent of ion flux/energy |
| 2 | Etching of Si-based materials | H2 | CF4, CxFy, CHxFy | Any | Decoupled control of polymer |
| 3 | Trench etch, mask open, barrier open | O2, N2, NF3 | Ar, FC | Low bias | Control etchant or oxidizer independent of ion flux/energy |
| 4 | Cell/HARC | Ar, N2 | Ar, FC, O2 | High Density & Bias | Inject metastables to lower Te -> less dissociation at same ion flux |
| 5 | Low-damage strip | N2 | CO2 | Low bias | Inject metastables to lower Te -> less dissociation at same ion flux |
| 6 | Low-damage strip | H2 | N2 | Low bias | Inject H radicals without damaging H2 VUV radiation |
| 7 | Deflourination | H2 | none | No plasma at wafer | In-situ downstream |

FIG. 3 – Table 1

PLASMA-ENHANCED ETCHING IN AN AUGMENTED PLASMA PROCESSING SYSTEM

PRIORITY CLAIM

This application is a continuation of U.S. patent application Ser. No. 13/626,793 (U.S. Pat. No. 9,039,911), filed on Sep. 25, 2012 entitled "Plasma-Enhanced Etching in an Augmented Plasma Processing System," which claims priority under 35 U.S.C. 119(e) to a commonly-owned provisional patent application entitled "Plasma-Enhanced Etching in an Augmented Plasma Processing System", U.S. Application No. 61/693,382, filed on Aug. 27, 2012 by Eric A. Hudson, all of which are incorporated herein by reference.

BACKGROUND OF THE INVENTION

Plasma-enhanced processing has long been employed to process substrates into integrated circuit dies, which may then be further processed into integrated circuits for use in a variety of electronic devices. Plasma-enhanced processing includes, for example, plasma-enhanced etching, plasma-enhanced deposition, plasma-enhanced cleaning, and the like.

In the field of plasma-enhanced etching, a plasma is typically generated from etching feed gas that may include different constituent gases. The feed gas is energized by an energy source to form a plasma to etch the surface of a substrate. By using a variety of masks, different patterns may be created on various layers of the substrate. The plasma itself may be created using one or more plasma generation technologies, including for example, inductively coupled plasma, capacitively coupled plasma, microwave plasma, etc.

Commercial plasma chambers for etching dielectric wafer films are primarily based upon parallel-plate capacitively-coupled plasma (CCP). In this type of chamber, RF excitation at one or more RF frequencies is applied from one or more RF sources to one or more electrodes to generate an etching plasma from the provided etching source (feed) gas. The etching characteristics of the chamber are controlled through variations in numerous input parameters including, for example, pressure, choice of feed gas, flow rate for each feed gas, power for the RF sources, etc.

Even with these numerous control parameters, it is known that the chemical and physical characteristics of the plasma are interdependent and difficult to independently control. In other words, changing an input parameter (such as RF power or pressure) tends to result in changes in multiple plasma parameters and/or changes in multiple etch result parameters. The interdependencies among various plasma characteristics and/or various wafer etch results tend to be amplified in narrow-gap, capacitively coupled plasma processing chambers of the type employed in modern dielectric etch applications.

To elaborate, consider a simple example etch process based on $CF_4$ feed gas only and a single RF excitation frequency. As RF power is increased, the degree of polymerization of the plasma-surface interaction will vary, typically increasing to a maximum and then decreasing. This behavior reflects the decomposition of $CF_4$ at lower RF powers to form polymerizing radical species such as CF2. At higher RF powers, secondary decomposition of those radicals forms less polymerizing species such as C+F. This phenomenon provides some control of the degree of polymerization in the plasma using RF power settings.

However, a change in the input RF power also affects physical properties of the plasma, for example the plasma density, ion flux, and ion energy. This is because the control of chemical properties of the plasma, such as polymerization, is affected by the same parameters (such as RF power) that control the physical properties of the plasma (such as plasma density) such that the chemical and physical properties are strongly interdependent.

If the effects on the plasma characteristics can be decoupled when one or more input parameters are manipulated, more precise control of wafer etch result and a wider process window may be possible. For example, if the density of a specific polymerizing species can be controlled independently (i.e., in a decoupled manner) from the ion flux or electron temperature, more precise control of wafer etch result and a wider process window may be achieved.

Improving the decoupling of plasma characteristics and/or process etch results in order to optimize the etch to meet current and future etch specifications is one among many goals of the various embodiments of the present invention.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Generally speaking, etch process optimization in chambers where input parameters are coupled in their effects on process result parameters tends to involve tradeoffs. Tuning the etch process to achieve etch specification with respect to one etch result parameter (e.g., etch rate) often results in changes and often detrimental changes in another etch result parameter (such as etch selectivity). In some cases, an acceptable trade-off cannot be found and the desired etch is simply not attainable with a given recipe. In other cases, time-consuming iterative optimization steps are required to find the appropriate combination of input parameters that achieves an acceptable trade-off among the various etch result parameters.

Embodiments of the invention seek to reduce the interdependencies among selective etch result parameters. By making certain input parameters less coupled in their effects on the process result parameters, individual process result parameters may be tuned in a manner that is more independent from other process result parameters. In other words, embodiments of the invention seek to influence, by changing certain input parameters, certain individual process result parameters substantially independently or more independently from other process result parameters. The net effect of this decoupling is faster tuning of input parameters (i.e., control parameters) to achieve a process result with a desired set of target process result parameters. In one or more embodiments, wider process windows are achieved by decoupling process result parameters. In these cases, new and previously unavailable substrate processing conditions may be realized, including regimes previously unavailable in prior art chambers where process result parameters are more coupled when one or more input parameters are changed.

In one or more embodiments, a secondary plasma is generated and employed to influence the primary plasma that is primarily responsible for etching the substrate. In the specific case of dielectric etches, the hardware improvement involves augmenting a parallel-plate capacitively-coupled chamber with a secondary plasma generated in separate plasma generating region. The secondary plasma injects chemically and/or physically excited neutral species into the primary wafer processing plasma region, resulting in an augmented primary plasma for processing the substrate.

In one or more embodiments, the primary plasma (which is disposed in the wafer processing plasma region immediately above the wafer surface) and the secondary plasma (which is generated in a separate secondary plasma generating region and injected into the wafer processing plasma region) are separated electrically and physically by a semi-barrier structure which allows neutral species to pass from the secondary plasma generating region to the primary plasma generating region but prevents appreciable transfer of charged particles, plasma, and/or electric fields from the primary plasma generating region to the secondary plasma generating region.

In one or more embodiments, the secondary plasma has an independent excitation source, such as an RF power supply or a microwave source, which can be controlled to affect the secondary plasma without directly or significantly affecting the charged particles or electric fields in the primary plasma generating region. The technology employed to generate the secondary plasma is not limited to any particular plasma generation technology and may include, for example, inductively coupled plasma, capacitively coupled plasma, microwave plasma, ECR (electron-cyclotron plasma), etc.

In an embodiment, the primary plasma in the primary plasma generating region (i.e., the plasma disposed above the substrate surface to etch the substrate surface) is generated using a parallel-plate arrangement via the capacitively coupling mechanism. In this embodiment, the substrate is disposed on a chuck that is energized by one or more RF signals. The upper electrode of this primary plasma generating region is grounded, and one or more confinement rings may be employed to further confine the primary plasma and/or to control the exhaust rate. The primary plasma is generated with its own set of input parameters and its primary feed gas, which may include a set of constituent feed gas(es) for forming the primary plasma. This CCP (capacitively coupled plasma) arrangement is more or less typical of capacitively coupled plasma processing chambers.

In addition to the primary plasma, a secondary plasma is generated in a separate secondary plasma generating region, with a different set of control parameters and utilizing a secondary feed gas that may include a set of constituent feed gas(es) for generating the secondary plasma. Neutral species are transferred from the secondary plasma to the primary plasma through the aforementioned semi-barrier, influencing the processing conditions at the substrate and thus modifying the process result. In one or more embodiments, the system is designed to minimize the influence of the primary plasma properties upon the secondary plasma while maximizing the influence of secondary plasma properties upon the primary plasma.

Because the plasma properties of the secondary plasma are substantially decoupled from the control parameters that affect the primary plasma, the new control parameters introduced for generating the secondary plasma represent additional process control parameters which are not closely coupled to the primary plasma control parameters.

In this way, embodiments of the invention achieve significant improvement in decoupling control parameters, and provide a greater ability to independently adjust the individual process results. This results in less restrictive trade-offs and a faster capability to optimize the etch to achieve a set of process results, which are now more decoupled. Additionally, the invention may also open up regimes of primary plasma properties which cannot be achieved using conventional methods, providing new process capabilities.

Further, in one or more specific embodiments, control parameters associated with the secondary plasma are focused upon controlling the dissociation of the secondary feed gas while control parameters associated with the primary plasma are focused upon controlling the ionization of the primary feed gas. Since the mechanism for controlling dissociation is decoupled from the mechanism for controlling ionization, improved process optimization and new operating windows may be achieved.

The features and advantages of embodiments of the invention may be better understood with reference to the figures and discussions that follow.

Figure 1:
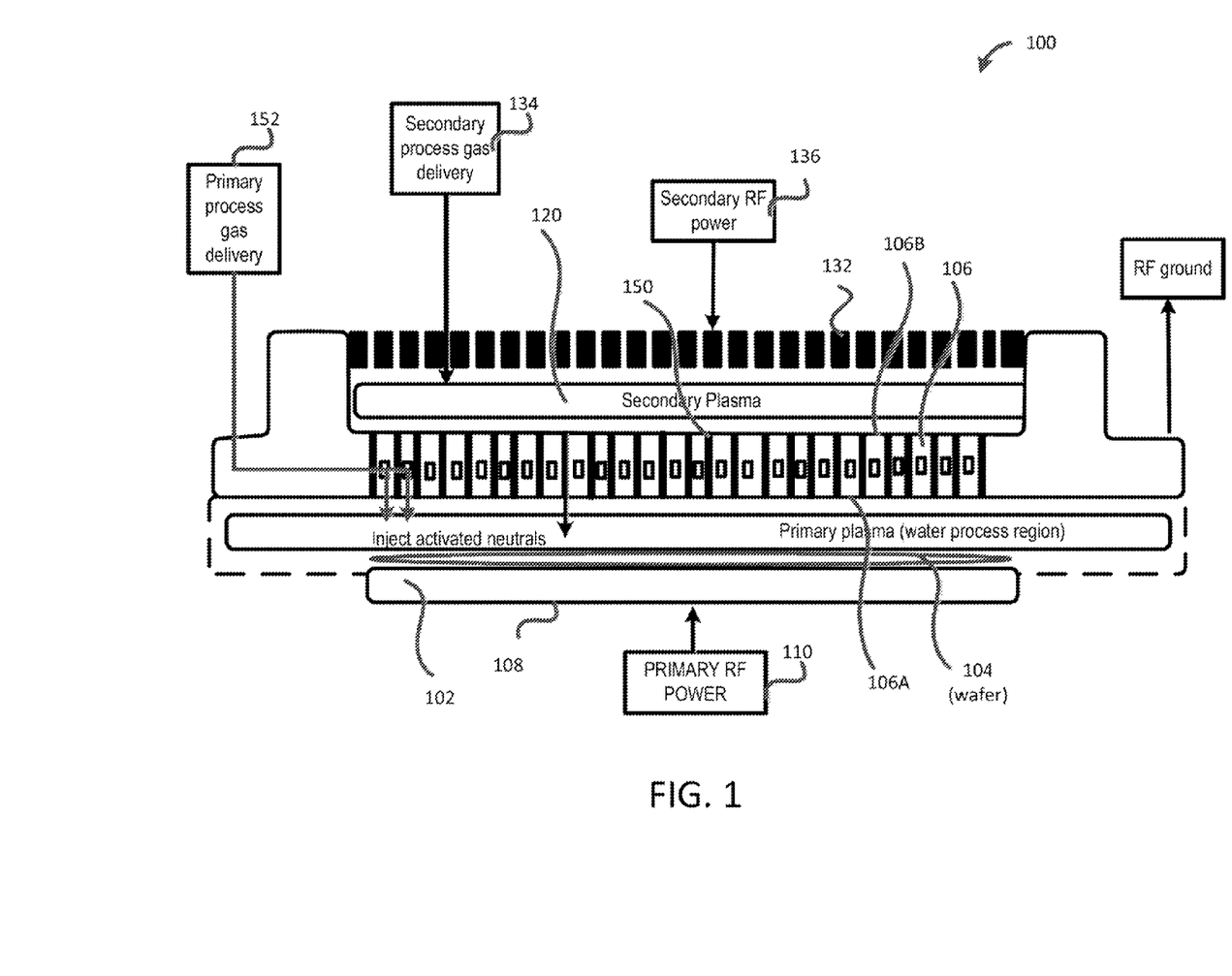
FIG. 1 shows, in accordance with an embodiment of the invention, a diagram of an augmented plasma processing chamber that includes two plasma generating region.

FIG. 1 shows, in accordance with an embodiment of the invention, an augmented plasma chamber 100 having two separate plasma generating regions. There is shown in FIG. 1 a primary plasma region 102, which is bound at its lower and upper extremities by substrate 104 and upper electrode assembly 106 respectively. A set of confinement rings (conventional and not shown) may also be optionally employed to surround primary plasma region 102 to prevent unwanted plasma ignition outside of the primary plasma generating region and/or to control the evacuation rate of byproduct exhaust gas(es) from primary plasma generating region 102.

In the embodiment of FIG. 1, substrate 104 rests on a chuck 108, which acts as the powered electrode for the primary plasma generating region 102. Chuck 108 is energized by an RF power source 110 with one or more RF signals. The lower surface 106A of upper electrode assembly 106 is grounded and acts as a second electrode for the primary plasma in primary plasma generating region 102. This primary plasma is generated using a parallel-plate, capacitively coupled plasma mechanism from a primary feed gas comprising one or more constituent gases for forming the primary plasma. The primary feed gas is fed directly into primary plasma region 102 from primary feed gas delivery system 152 in FIG. 1.

In the example of FIG. 1, the secondary plasma region 120 is also another parallel-plate capacitively coupled arrangement that is bound at its lower and upper extremities by the upper surface 106B of upper electrode assembly 106 and top electrode assembly 132 respectively. In the example of FIG. 1, secondary plasma region 120 is bound by chamber wall 134 although a set of confinement rings (conventional and not shown) may also be optionally employed to surround secondary plasma region 120 to prevent unwanted plasma ignition outside of the secondary plasma generating region and/or to control the evacuation rate of byproduct exhaust gas(es) from the secondary plasma generating region 120. Top electrode assembly 132 may be movable in order to control the volume of the secondary plasma generating region and/or to control the gas residence time. The gas residence time may also be controlled by controlling the by-product exhaust rate.

The upper surface 106B of upper electrode assembly 106 is grounded and acts as one electrode for the secondary plasma in secondary plasma generating region 120. Top electrode assembly 132 is energized by a separate RF power supply 136, which may supply one or more RF signals to top electrode assembly 132. This secondary plasma is generated from a secondary feed gas comprising one or more constituent gases for forming the secondary plasma. The secondary feed gas is fed directly into secondary plasma region 120 from secondary feed gas delivery system 134 in FIG. 1.

Although the secondary plasma is generated using a parallel plate, capacitively coupled plasma generation arrangement, it should be noted that embodiments of the invention are not limited to this plasma generation technology for generating the secondary plasma. It is contemplated that the secondary plasma may be generated using, for example, an inductively coupled plasma generation mechanism employing one or more RF coils or antennas to inductively couple the RF energy to the secondary feed gas. Alternatively or additionally, it is contemplated that the secondary plasma may be generated using, for example, a microwave source and an appropriate microwave plasma generation chamber. In fact, any suitable plasma generation technology may be employed to independently generate the secondary plasma.

As mentioned, upper electrode assembly 106 acts as a ground electrode for both the primary plasma generating region 102 and the secondary plasma generating region 120. Further, in one or more embodiments, upper electrode assembly 106 performs the gas delivery function for the primary feed gas into the primary plasma generating region 102. For example, upper electrode assembly 106 may include a showerhead-type arrangement or an injection jet orifice-type arrangement for providing the primary feed gas into the primary plasma generating region. If desired, upper electrode assembly may be temperature controlled by providing heating/cooling coils circulating the appropriate heating/cooling fluid through channels built into upper electrode assembly 106.

As mentioned, the secondary plasma in secondary plasma generating region 120 is generated using a different secondary feed gas having a different composition (e.g., flow rate and/or constituent gases and/or gas residence time) from the primary feed gas. More importantly, it is desirable that neutral species from the secondary plasma be allowed to migrate from the secondary plasma generating region 120 into primary plasma generating region 102 but charged species are prevented from migrating from the primary plasma generating region 102 into secondary plasma generating region 120. To achieve this goal, one or more of the innovations below may be employed.

For example, the operating conditions in the secondary plasma region may be set to emphasize dissociation of the secondary feed gas over ionization. To elaborate, dissociation refers generally to the interaction of electrons with neutral molecules to break the chemical bond and to produce neutral reactive species. For example, $H_2$ may be dissociated into two hydrogen atoms, both of which may be neutral. Ionization, on the other hand, refers generally to the interaction of electrons with neutral molecules to produce positive ions and electrons. Ionizing $H_2$ produces a $H_2+$ ion and an electron, for example. By setting input parameters for the secondary plasma generation to emphasize dissociation of the secondary feed gas over ionization, more dissociated neutral species may be obtained in the secondary plasma generating region.

As another alternative or additional innovation, the pressure in the secondary plasma generating region 120 may be set higher than the pressure in the primary plasma generating region 102 to encourage the migration of the dissociated neutral species from secondary plasma generating region 120 to primary plasma generating region 102. The pressure in the secondary plasma generating region may be set in a regime to discourage neutral species recombination, in one or more embodiments.

As another alternative or additional innovation, the holes or slots 150 disposed in upper electrode assembly 106 to permit the migration of dissociated neutral species from secondary plasma generating region 102 to primary plasma generating region 120 may have a high aspect ratio to discourage plasma formation in the holes. These holes or slots may be designed to alternatively or additionally act as a neutral diffusion barrier to prevent neutral species migration from the primary plasma generating region 102 to secondary plasma generating region 120. Equally important is the concern for uniformity of migrated neutral species distribution in the primary plasma generating region. For this reason, it is desirable to employ an array of holes or slots with the holes or slots uniformly or widely distributed above the substrate surface in order to ensure a relatively uniform distribution of migrated neutral species over the substrate to optimize process uniformity across the substrate.

As another alternative or additional innovation, the pressure in the secondary plasma generating region 120 and/or the pressure in the primary plasma generating region 102 may be set to encourage laminar flow in the holes or slots. A laminar flow condition would reduce the number of collisions between the migrating neutral species and the walls of the holes or slots, thereby reducing neutral species recombination prior to being delivered to the primary plasma generating region 102.

More importantly, input parameters that control the dissociation of the secondary plasma may be controlled independently from input parameters that are employed to generate the primary plasma. As such, dissociation and ionization may be tuned in a more decoupled manner, leading to more efficient process tuning and wider operating conditions, including process conditions previously unavailable with prior art chambers whereby the mechanisms for dissociation and ionization are highly interdependent and coupled.

In accordance with embodiments of the present invention, dielectric etching in the augmented plasma processing chamber involves the use of a secondary feed gas that is different in composition from the primary feed gas. The inventors herein propose various combinations of secondary feed gas/primary feed gas for plasma generation in the two respective plasma generating regions. The dissociated neutral species from the proposed secondary feed gas may be controlled in a decoupled manner from the control mechanisms that govern the generation of the primary plasma in the primary plasma generating region.

Various unique combination of secondary feed gas into the secondary plasma generating region (which may employ a CCP-type mechanism for plasma generation) and primary feed gas into the primary plasma generating region (which may also employ a CCP-type mechanism for plasma generation) are discussed below. It should be understood that in other embodiments, different plasma generation mechanisms (such as inductively coupled plasma or ECR or microwave) may be employed for generating the secondary plasma and/or the primary plasma. There is also no requirement that the same plasma generating technology/mechanism must be employed for both plasma generating regions.

In one or more embodiments, the secondary feed gas comprises a different set of constituent gases when compared to the set of constituent gases comprising the primary feed gas. In one or more embodiments, the constituent gases are mutually exclusive in the sense that if a constituent gas is present in the primary feed gas, that constituent gas is not employed in the secondary feed gas and vice versa. In other embodiments, the constituent gases are not mutually exclusive in that a given constituent gas (such as argon) may be present in both the primary feed gas and the secondary feed gas.

In one or more embodiments, polymer depositing gases such as one or more of the fluorocarbon gases (e.g., $CF_4$, $C_4F_8$, CHF3, etc.) may not be employed in the secondary feed gas to avoid a build up of polymer in the holes or slots employed to transfer the neutral species from the secondary plasma generating region to the primary plasma generating region. In other embodiments, polymer depositing gases such as one or more of the fluorocarbon gases (e.g., $CF_4$, $C_4F_8$, CHF3, etc.) may be employed in the secondary feed gas and any polymer buildup in the holes or slots employed to transfer the neutral species from the secondary plasma generating region to the primary plasma generating region may be addressed with cleaning technologies such as waferless autoclean.

Figure 2:
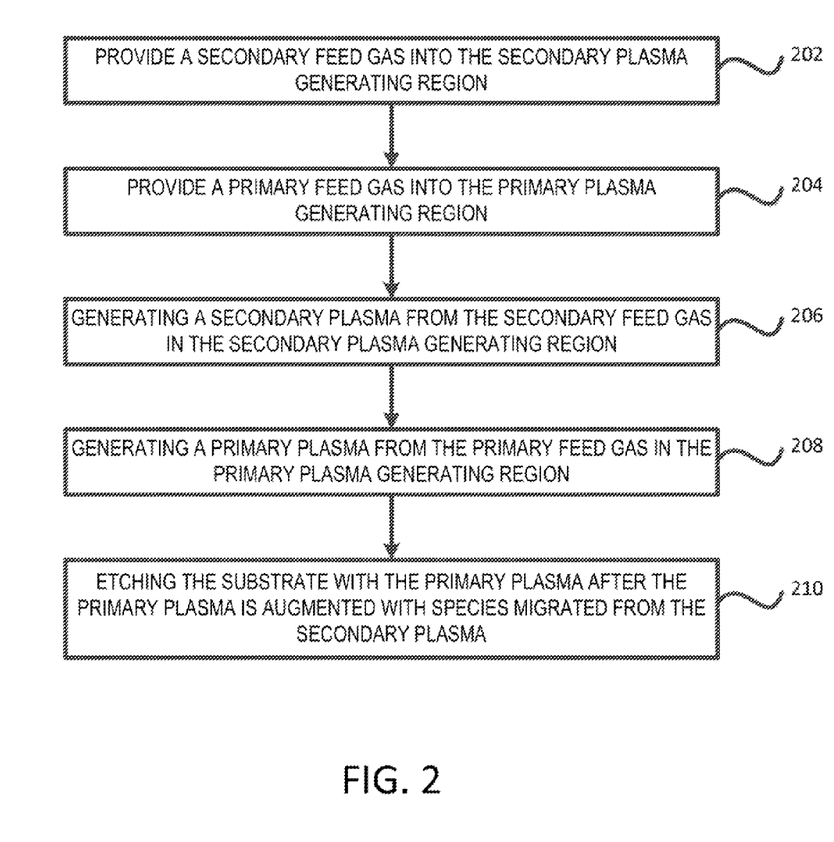
FIG. 2 shows, in accordance with an embodiment of the invention, a general method for performing dielectric etch using an augmented plasma processing chamber.

FIG. 2 shows, in accordance with an embodiment of the present invention, a general method for performing dielectric etch using the augmented plasma processing chamber that substantive decouples control over dissociation from control over ionization of the feed gases. Generally speaking, embodiments of the invention permit selective dissociation of certain constituent gases and not others by separating the constituent gases into two different feed gases: the secondary feed gas that is fed into the secondary plasma generating region and the primary feed gas that is fed into the primary plasma generating region. Further, the input parameters that control plasma generation and/or dissociation in the secondary plasma generating region are independent from the input parameters that control the plasma generation in the primary plasma generating region. In this manner, each plasma may be independently tuned with reduced, minimal, or no influence or interdependency or coupling of plasma results between the two plasmas when one plasma is tuned.

With reference to FIG. 2, in step 202, a secondary feed gas is provided to the secondary plasma generating region. In step 204, a primary feed gas is provided to the primary plasma generating region. In step 206, a secondary plasma is generated from the secondary feed gas. Simultaneously, in step 208, a primary plasma is generated from the primary feed gas.

During steps 206 and 208, process conditions (such as higher pressure in the secondary plasma generating region and/or a processing regime that emphasizes dissociation in the secondary plasma generating region and a processing regime that emphasizes ionization in the primary plasma generating region, and the like) induces the migration of reactive neutral species from the secondary plasma in the secondary plasma generating region into the primary plasma in the primary plasma generating region.

The dissociation of the secondary feed gas is independently controlled by a set of input parameters into the secondary plasma generating region. It is contemplated that the generation of radical species in the secondary plasma generating region may be tuned by varying the RF power level (e.g., RF power to the top electrode 132), the flow rate of secondary feed gas, the secondary feed gas residence time, and/or the RF frequency employed to generate the secondary plasma.

The generation of the primary plasma in the primary plasma generating region is independently controlled by a set of input parameters into the primary plasma generating region. In this manner, these two plasmas may be generated and tuned in a decoupled manner.

The dissociated neutral species from the secondary plasma are then employed to augment the primary plasma. The augmented plasma in the primary plasma generating region is then employed to etch the dielectric layer on the wafer surface (step 210).

In one or more embodiments, fluorocarbon (FC) or hydro fluorocarbon (HFC) source gases are employed in the primary gas feed mixture, in combination with $H_2$ as part of the secondary gas feed mixture. These combinations are shown in Rows 1 and 2 of Table 1 in FIG. 3 and may be useful in fluorine-based etch applications (e.g., to etch $SiO_x$, SiCOH, $SiN_x$, SiCN, etc.) where the secondary plasma is used to increase the extent of polymerization in the primary plasma and/or on the substrate surface.

It is well known that small amounts of $H_2$ added to FC or HFC mixtures can cause greater plasma polymerization. In accordance with one or more embodiments, the secondary plasma produces H radicals, which are transferred to the primary plasma, influencing the degree of polymerization in a highly decoupled manner in the wafer processing region (i.e., in the primary plasma generating region).

It is believed that lower fluxes of H will increase polymerization, and then as H radical flux increases (e.g., by increasing power or pressure in secondary plasma), eventually the H radicals will begin to decrease polymerization due to ability of H radicals to etch polymer. The expectation is that the effect of the injected H radicals from the secondary plasma will be qualitatively different from the simple addition of $H_2$ source gas to the primary gas mixture.

Figure 3:
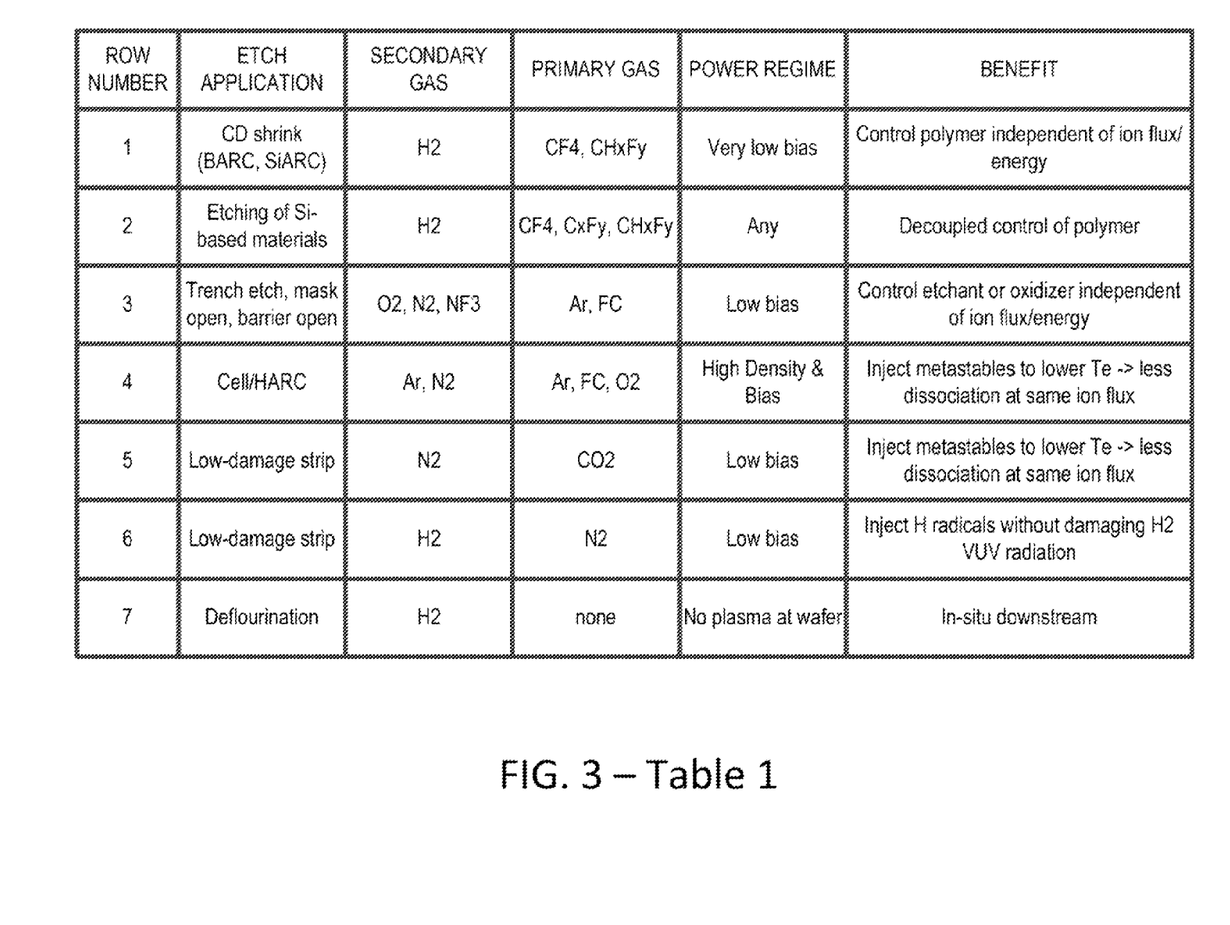
FIG. 3 shows, in accordance with various embodiments of the invention, various combinations of parameters for performing dielectric etch using an augmented plasma processing chamber.

In one or more embodiments, the combination of Row 1, Table 1 may be useful for applications such as ARC (anti-reflective coating) open. The ARC layer may, in some applications, represent for example bottom ARC, also known as BARC, or silicon-containing ARC, also known as SiARC. This combination of Row 1, Table 1 may also be useful for CD (critical dimension) shrink of holes or vias on the substrate surface, where very low powers (see Power Regime in Row 1 of Table 1) are typically required to control feature faceting and it is therefore difficult to generate sufficient polymer. By pre-dissociating the $H_2$ in the secondary plasma generating region in the case of Row 1 of Table 1, polymer formation control may be improved independent of ion flux or ion energy level in the primary plasma generating region.

Alternatively, for general etching of Si-based materials (Row 2, Table 1), $H_2$ may be input into the secondary plasma generating region while $CF_4$, $C_xF_y$, and/or $CH_xF_y$ (with x and y representing integer values) constituent gases may be input into the primary plasma generating region. The power regime for the primary plasma generating region can be any suitable power regime (see Row 2, Table 1). By pre-dissociating the $H_2$ in the secondary plasma generating region in the case of Row 2 of Table 1, an additional independent control knob is provided for decoupled control of polymer formation.

One benefit of these embodiments is that the flux of vacuum ultraviolet (VUV) radiation due to the $H_2$ molecule may be greatly reduced in the wafer processing region (i.e., the primary plasma generating region immediately above the substrate surface), compared to the case where $H_2$ is part of the primary gas mixture, because a large fraction of $H_2$ will be dissociated in the secondary plasma. This may have benefits at the substrate because $H_2$-induced VUV radiation is intense and is known to damage low-k dielectric materials.

For similar reasons, a photoresist strip process in the presence of low-k dielectric materials can be designed to include the beneficial H radicals while largely excluding the damaging $H_2$-induced VUV radiation. H radicals are known to cause less damage to low-k dielectric materials than O radicals, but ordinarily it is difficult to produce H without using $H_2$ source gas in the primary gas mixture. In the inventive case, $H_2$ is part of the secondary gas mixture to form the secondary plasma to provide injected H radicals but very little $H_2$ into the primary plasma. The source gases for the primary plasma can include $N_2$ or other fairly harmless and/or inert gases to sustain the plasma and provide ions for bombardment, for example.

In the case where it is desirable to introduce polymerizing chemistries in the secondary plasma, the secondary gas mixture could include some or all of the constituent polymerizing constituent gases if desired. In this case, some or all of the polymerizing gases may be pre-dissociated in the secondary plasma generating region before entering the primary plasma generating region. For example, a typical oxide etch chemistry may include $C_4F_8$, $O_2$, and Ar. In one or more embodiments, some or all of the $C_4F_8$ and/or some or all of the Ar may be input into the secondary plasma generating region for pre-dissociation. The $O_2$ may be input into the primary plasma generating region only in this embodiment. Conversely, in another embodiment, the $O_2$ may be input into the secondary plasma generating region for pre-dissociation while the $C_4F_8$ and Ar may be input into the primary plasma generating region.

Another category of applications is fluorine-based etch applications (e.g., to etch SiOx, SiCOH, SiNx, SiCN, etc.) where the secondary plasma is used to decrease the extent of polymerization in the primary plasma. This is accomplished by selecting fluorocarbon (FC) or hydro fluorocarbon (HFC) source gases as part of the primary process gas mixture, in combination with a polymer-retarding gas such as $O_2$, $N_2$, $NF_3$, etc. as part of the secondary process gas mixture. Common applications include such dielectric etches that rely on fluorocarbon such as trench etches, mask open, barrier open, etc. These applications are shown in Row 3 of Table 1 where the power regime for the primary plasma generating region is low bias.

It is well known that small amounts of $O_2$, $N_2$, $NF_3$ added to FC or HFC mixtures causes decreased plasma polymerization, because these gases act to etch polymer. In one or more embodiments, the secondary plasma produces O, N, F, and/or $NF_x$ radicals which are transferred to the primary plasma, influencing the degree of polymerization (by influencing the degree of polymer removal via etchant or oxidizer control) in the primary plasma with a degree of control and decoupling which would not be achieved by the prior art by simply adding the polymer-retarding gas to the primary process gas mixture.

In one or more embodiments, $NF_3$ and Ar are input into the secondary plasma generating region for pre-dissociation while fluorocarbon gases and $O_2$ are input into the primary plasma generating region. In one embodiment, a silicon top electrode is employed in the secondary plasma generating region and chemically produced $SiF_x$ (e.g., SiF, $SiF_2$, $SiF_3$, $SiF_4$, etc.) from the etch reaction in the secondary plasma generating region may be injected from the secondary plasma generating region into the primary plasma generating region. This approach may permit better and/or more independent control of SiFx injection may be useful for cell etch applications, for example.

Another category of applications relies on a different role of the secondary plasma. Instead of injecting chemically activated radical species, as in the previous categories, the role of the secondary plasma in these embodiments is to inject hyperthermal energetic species such as atoms and molecules in metastable excited electronic states and molecules in highly excited vibrational states. These applications are shown in Rows 4 and Row 5 of Table 1.

For example, He, Ne, Ar, Kr, and/or Xe could be included in the secondary process gas mixture, in order to inject metastable states of these atoms into the wafer processing plasma. Alternatively or additionally, $N_2$ could be included in the secondary process gas mixture because $N_2$ is known to form appreciable densities of metastables and vibrationally excited states under typical plasma conditions, with a relatively low degree of dissociation. These energetic species interact differently with the primary plasma, as compared to atoms and molecules in the primary process gas mixture which are introduced in ground electronic states and thermalized vibrational states. In particular, energetically excited atoms and molecules have lower ionization thresholds, and will tend to reduce the electron temperature (Te) of the primary plasma and/or increase the plasma density.

The control parameters of the secondary plasma, including RF power and pressure, could be used to independently vary the injection of energetic species into the wafer processing primary plasma. These secondary control parameters should influence the primary plasma conditions to produce results that are fairly decoupled from the primary control parameters. Additionally, the ability to produce a lower electron temperature primary plasma without sacrificing plasma density should open up high-ion-flux/low-dissociation plasma regimes which are not ordinarily available with prior art hardware and methods. Applications include high aspect ratio contact (HARC) etching or cell etching, where the power regime may be high bias with high density plasma in the primary plasma generating region.

Another application may involve low damage photoresist strip (see Row 6 of Table 1) where it is desirable to prevent damage to the low-K material (such as at sidewalls or bottom of vias) while performing photoresist strip. In this application, $H_2$ and/or $N_2$ may be input into the secondary plasma generating region for pre-dissociation to form hydrogen radicals (which tends not to generate low-K damaging VUV radiation compared to $H_2$) and/or nitrogen radicals. Further, hydrogen and/or nitrogen radicals maybe increased without a corresponding increase of ion flux in the primary plasma generating region. This is advantageous for avoiding damage to the low-K material as increased ion flux tends to degrade the low-K material. $CO_2$ may be input into the primary plasma generating region, for example, if desired. The preferred power regime in the primary plasma generating region is low bias, in an embodiment.

Another category of applications is somewhat different in that the only the secondary plasma is powered. An example of this category of applications is shown in Row 7 of Table 1 and is useful in situations where full plasma processing is only needed for some steps of a multi-step processing sequence. In these embodiments, for certain steps, it would be desirable to process the wafer with a downstream plasma condition (e.g., downstream strip or downstream etch), such that activated neutral species such as radicals reach the substrate but there is no direct plasma contact. This achieves a highly chemical treatment regime with no ion or electron bombardment from the primary plasma. This process regime may be useful, for example, to cure polymers (mask hardening), to defluorinate etched features to prevent metal corrosion in air, or to strip photoresist, or the like in the same tool that is employed for other etches. In this manner, the same etch chamber may be employed for both etching and downstream strip/downstream etch without requiring the use of another chamber for the downstream strip/downstream etch as would be the case with prior art hardware.

One or more embodiments of the invention relate to a simplified migration path for tuning process parameters in order to achieve target process parameter results. With the RF power to the secondary plasma generating region turned off and the secondary feed gas injected into the secondary plasma generating region and simply allowed to diffuse or migrate into the primary plasma generating region (or all feed gases inputted into the primary plasma generating region), the situation is analogous to prior art chamber use scenarios where all constituent gases are injected into a single plasma generating region. This provides a convenient and familiar starting point for chamber operators to start the optimizing process. By turning on the RF power to the secondary plasma generating region, an independent control knob is provided for controlling the dissociation of the secondary feed gas in a manner that is not available in the prior art. The turning on of the RF power to the secondary plasma generating region provides a gradual introduction to decoupled process tuning for chamber operators, which simplifies training due to the incremental versus disruptive nature of the improved tuning process and the fact that the optimization starts from a known prior art-like starting point.

As can be appreciated from the foregoing, embodiments of the invention open up process windows by making input parameters less coupled in their effects on process results. Accordingly, tradeoffs between interdependent process results are fewer, and process tuning may be performed more rapidly to achieve a desired set of process results since changes targeted for one process result has less influence on another process result when the process results are more decoupled. In the dielectric etch applications, the decoupling of dissociation from ionization permits faster process tuning to achieve high performance process result targets or permits access to wafer processing conditions that are unavailable with prior art dielectric etch chambers. Various combinations of primary and secondary feed gases have been proposed for improving different etch applications or for different etch effects.

Further, embodiments of the invention facilitate incremental migration to existing process optimization methodology. Tool operators may start with a current recipe as a starting point by turning off the power to the secondary plasma generating region and gradually utilize the decoupling benefits of embodiments of the invention by gradually turning on the power and/or varying other input parameters to the secondary plasma generating region. This is a distinct advantage in training and use over more disruptive approaches, which tend to increase adoption risks for tool operators.

While this invention has been described in terms of several preferred embodiments, there are alterations, permutations, and equivalents, which fall within the scope of this invention. Although various examples are provided herein, it is intended that these examples be illustrative and not limiting with respect to the invention. Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for etching a substrate in a plasma processing chamber having a semi-barrier structure separating a primary plasma generating region from a secondary plasma generating region, comprising:
   providing a primary feed gas to the primary plasma generating region from outside the secondary plasma generating region;
   providing a secondary feed gas into the secondary plasma generating region, the secondary feed gas being different from the primary feed gas;
   generating a primary plasma from the primary feed gas;
   generating a secondary plasma from the secondary feed gas; and
   exposing the substrate to species in the primary plasma generating region to etch the substrate,
   wherein the semi-barrier structure is configured to allow neutral reactive species to migrate from the secondary plasma generating region to the primary plasma generating region across the semi-barrier structure.

2. The method of claim 1 wherein the etch is a dielectric etch.

3. The method of claim 1 wherein a pressure in the secondary plasma generating region is greater than a pressure in the primary plasma generating region.

4. The method of claim 1 wherein the secondary feed gas is a non-polymer forming gas.

5. The method of claim 1 further comprising setting input parameters for the secondary plasma generating region to emphasize dissociation of the secondary feed gas, wherein the secondary feed gas includes $H_2$.

6. The method of claim 5 wherein the primary feed gas includes at least one of $CF_4$, $C_xF_y$, and $CH_xF_y$, where x and y are integer values.

7. The method of claim 1 further comprising setting input parameters for the secondary plasma generating region to emphasize dissociation of the secondary feed gas, wherein the secondary feed gas includes at least one of $O_2$, $N_2$ and $NF_3$.

8. The method of claim 7 wherein the primary feed gas includes at least one of argon and a fluorocarbon-containing gas.

9. The method of claim 1 further comprising setting input parameters for the secondary plasma generating region to emphasize dissociation of the secondary feed gas, wherein the secondary feed gas includes at least one of argon and $N_2$.

10. The method of claim 9 wherein the primary feed gas includes at least one of argon, $O_2$ and a fluorocarbon-containing gas.

11. The method of claim 9 wherein the primary feed gas includes $CO_2$.

12. The method of claim 1 further comprising setting input parameters for the secondary plasma generating region to emphasize dissociation of the secondary feed gas, wherein the secondary feed gas includes $H_2$ and wherein the primary feed gas includes $N_2$.

13. A method for etching a substrate in a plasma processing chamber having a semi-barrier structure separating a primary plasma generating region from a secondary plasma generating region, comprising:

generating a primary plasma from a primary feed gas provided to the primary plasma generating region;

generating a secondary plasma from a first secondary feed gas provided to the secondary plasma generating region, such that neutral species migrate from the secondary plasma generating region to the primary plasma generating region across the semi-barrier structure;

generating a third plasma from a second secondary feed gas provided to the secondary plasma generating region, such that a second species migrates from the secondary plasma generating region to the primary plasma generating region across the semi-barrier structure; and exposing the substrate to species in the primary plasma generating region to etch the substrate, wherein the primary feed gas is provided to the primary plasma generating region from outside the plasma processing chamber.

14. The method of claim 13 wherein the etch represents a dielectric etch.

15. The method of claim 13 further comprising setting input parameters for the secondary plasma generating region to emphasize dissociation of at least one of the first secondary feed gas and the second secondary feed gas.

16. The method of claim 13 wherein the etch represents defluorination.

* * * * *